(12) United States Patent
Kobori

(10) Patent No.: US 7,576,483 B2
(45) Date of Patent: Aug. 18, 2009

(54) DISPLAY DEVICE, DISPLAY UNIT, AND IMAGING DEVICE

(75) Inventor: Isamu Kobori, Tokyo (JP)

(73) Assignee: Sony Corporation, Tokyo (JP)

( * ) Notice: Subject to any disclaimer, the term of this patent is extended or adjusted under 35 U.S.C. 154(b) by 264 days.

(21) Appl. No.: 11/065,271

(22) Filed: Feb. 24, 2005

(65) Prior Publication Data

US 2005/0189857 A1 Sep. 1, 2005

(30) Foreign Application Priority Data

Feb. 27, 2004 (JP) ............................ P2004-054473

(51) Int. Cl.
*H01J 1/62* (2006.01)
*H01J 63/04* (2006.01)
(52) U.S. Cl. ....................... 313/504; 313/505; 313/506; 313/501; 313/498
(58) Field of Classification Search ................. 313/110, 313/504–506
See application file for complete search history.

(56) References Cited

U.S. PATENT DOCUMENTS

| | | | | |
|---|---|---|---|---|
| 5,294,870 | A * | 3/1994 | Tang et al. ................... | 313/504 |
| 5,837,391 | A * | 11/1998 | Utsugi ........................ | 428/690 |
| 5,909,081 | A * | 6/1999 | Eida et al. .................... | 313/504 |
| 6,013,982 | A * | 1/2000 | Thompson et al. ........... | 313/506 |
| 6,249,372 | B1 * | 6/2001 | Kobayashi et al. ........... | 359/326 |
| 6,358,652 | B1 * | 3/2002 | Tomiuchi et al. .............. | 430/7 |
| 6,548,956 | B2 * | 4/2003 | Forrest et al. ................ | 313/504 |
| 6,653,778 | B1 * | 11/2003 | Tomiuchi et al. ............. | 313/501 |
| 6,696,785 | B2 * | 2/2004 | Shimoda et al. .............. | 313/504 |
| 7,129,634 | B2 * | 10/2006 | Boroson et al. .............. | 313/504 |
| 2003/0170491 | A1 * | 9/2003 | Liao et al. .................... | 428/690 |
| 2004/0012330 | A1 * | 1/2004 | Ohshita et al. ............... | 313/504 |
| 2004/0135502 | A1 * | 7/2004 | Kobayashi et al. ........... | 313/506 |
| 2004/0258954 | A1 * | 12/2004 | Takasu et al. ................ | 428/690 |
| 2005/0147844 | A1 * | 7/2005 | Hatwar et al. ................ | 428/690 |
| 2005/0244673 | A1 * | 11/2005 | Satoh et al. .................. | 428/690 |

FOREIGN PATENT DOCUMENTS

| | | |
|---|---|---|
| JP | 10-170918 | 6/1998 |
| JP | 10-255983 | 9/1998 |
| JP | 2003-150109 | 5/2003 |
| JP | 2003-243153 | 8/2003 |

* cited by examiner

*Primary Examiner*—Nimeshkumar D. Patel
*Assistant Examiner*—Thomas A Hollweg
(74) *Attorney, Agent, or Firm*—Sonnenschein Nath & Rosenthal LLP

(57) ABSTRACT

The invention provides a display device capable of improving color separation characteristics by using a color filter having high transmittance. An organic light emitting device emits blue light, red light, and green light, and the emission intensity of the green light is relatively lower than those of the blue light and the red light. A green fluorescence conversion layer for absorbing a blue wavelength component and emits green light is provided between the organic light emitting device and a green filter layer. Color purity of blue and red is improved by decreasing a green light emitting component causing decreasing color purity when blue and red are separated by a color filter, and by using the color filter having high transmittance and low density. The decreased green light emitting component is complemented with the green fluorescence conversion layer, chromaticity is adjusted by a green filter layer, and thereby light emitting efficiency and color reproducibility are improved.

10 Claims, 14 Drawing Sheets

DISPLAY DEVICE, DISPLAY UNIT, AND IMAGING DEVICE

BACKGROUND OF THE INVENTION

1. Field of the Invention

The present invention relates to a display device comprising a light emitting device such as an organic light emitting device, a display unit constructed from this display device, and an imaging device consisting of a combination of a display portion constructed from this display device and an imaging portion.

2. Description of the Related Art

As one of flat panel displays, an organic light emitting display using an organic light emitting device (organic EL (Electroluminescence) device) has been recently noted. The organic light emitting display has characteristics that its visual field angle is wide and its power consumption is low since it is a self-light emitting type display. The organic light emitting display is also thought of as a display having sufficient response to high-definition and high-speed video signals, and is under development toward the practical use.

As the organic light emitting device, for example, an organic light emitting device, wherein a first electrode, an organic layer including a light emitting layer, and a second electrode are sequentially layered over a substrate is known. In order to apply this device to a full color display, it is necessary to form fine pixel for emitting light of red, blue, and green, the three primary colors. As a method to form such pixel, method for individually coloring the pixel of the three primary colors by using a deposition mask, method for combining a white light emitting device and a color filter, method for combining a blue light emitting device and a fluorescence conversion layer (fluorescence conversion method) and the like can be cited.

In the white color filter method, there is a light loss when color separation is performed by the color filter. In general, the color filter cannot sharply cut a target wavelength, and has broad transmission characteristics. Therefore, for example, since wavelength bands of blue and green are close to each other, separation is difficult. In order to perfectly separate blue, a color filter having a high density is necessary, and transmittance of the color filter should be lowered.

In the fluorescence conversion method, conversion efficiency from the blue light emitting device to red is low. One of the reasons thereof is that while an excitation light source (EL light emission) is blue, an absorption wavelength band of a red conversion layer exists in the vicinity of orange. A method for resolving this problem by increasing overlap of excitation light and the absorption wavelength band is recently suggested. This method uses an EL spectrum, wherein a yellow light emitting component is added to the original blue light emission. Thereby, a red element from the yellow light emission is added to the red light emission from the fluorescence conversion layer with the improved conversion efficiency, and intensity of the red light emission is improved as a whole.

However, in this method, there is a problem that the yellow light emitting component added for the overlap becomes a cause to lower color purity when blue, red, and green are separated by the color filter. When the color purity is tried to be raised, it cannot be avoided that efficiency is further lowered. For example, in the case of red, a color filter for sufficiently cutting the yellow light emitting component is required to raise the color purity. Similarly, in the case of green, the yellow light emitting component close to green needs to be cut by a color filter having a sufficient density, leading to lowering transmittance of the color filter.

As above, in order to perform color separation into red, green, and blue light having good color purity by the color filter by using the EL spectrum having intensity also for the wavelength band slightly shifted from red, green, and blue, a color filter having a higher density is required. The reason thereof is that practical color filter characteristics are broad transmission characteristics centering on red, green, and blue. As a result, as long as the color separation is performed by the color filter, it is not avoidable that the transmittance of the color filter is lowered when a light emitting component other than desired red, green, and blue is included in the EL spectrum, leading to lowering total efficiency.

In this method, the conversion efficiency of red is still low. Therefore, a thick red fluorescence conversion layer is required, and therefore steps cannot be simplified.

SUMMARY OF THE INVENTION

In light of the foregoing, it is an object of the invention to provide a display device having high efficiency and superior color reproduction capable of improving color separation characteristics by using a color filter having high transmittance, a display unit comprising this display device, and an imaging device comprising a display portion constructed from this display device.

The display device according to the invention includes: a light emitting device for emitting blue light, red light, and green light, the emission intensity of the green light is relatively lower than those of the blue light and the red light; a color filter provided to face the light emitting device, which has three filter layers corresponding to three colors, blue, red, and green; and a green fluorescence conversion layer provided between the light emitting device and the green filter layer of the color filter, which absorbs blue light and emits green light.

According to the display device of the invention or the display unit of the invention, the intensity of the green light emission in the light emitting device is set to relatively lower than those of blue light and red light, and thereby the green light emitting component causing decrease of color purity in color separation for blue and red in the color filter is decreased. Therefore, it becomes possible to improve the color purity of blue and red by using a color filter having high transmittance and low density. Consequently, efficiency of color separation of blue and red can be improved.

Other and further objects, features and advantages of the invention will appear from the following description.

DETAILED DESCRIPTION OF THE PREFERRED EMBODIMENTS

Embodiments of the invention will be hereinafter described in detail with reference to the drawings.

First Embodiment

Figure 1:
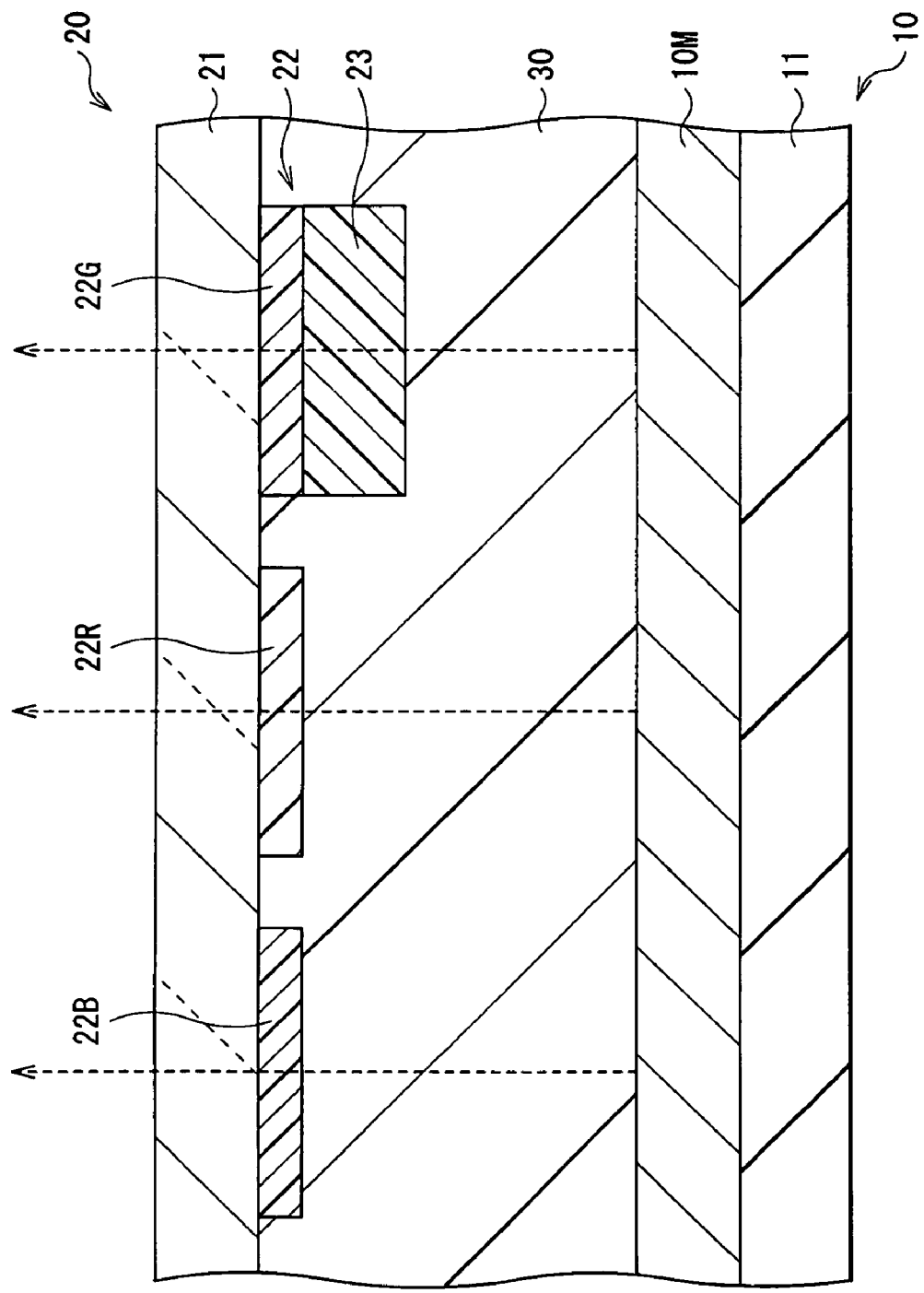
FIG. 1 is a cross section showing a construction of a display device according to a first embodiment of the invention.

FIG. 1 shows a cross sectional structure of a display device according to a first embodiment of the invention. The display device is used for a thin organic light emitting display unit or the like. For example, a driving panel 10 and a sealing panel 20 are arranged oppositely, and their whole faces are bonded together by an adhesive layer 30. The driving panel 10 has an organic light emitting device 10M of multicolor light emission for emitting blue, red, and green light, or of white light emission on a driving substrate 11 made of an insulating material such as glass. The sealing panel 20 has a color filter 22 including three types of filter layers 22B, 22R, and 22G of blue, red, and green, on a sealing substrate 21 made of a material such as glass transparent to light generated in the organic light emitting device 10M.

It is preferable that in the organic light emitting device 10M, the emission intensity of blue band and red band are 20% or more of the visible light region (wavelength: 420 nm to 680 nm). Thereby, required intensity of red can be obtained by emitting red light having sufficient intensity by only EL light emission in the organic light emitting device 10M. Further, a conventional red conversion layer having bad conversion efficiency becomes unnecessary, and manufacturing process can be simplified.

Figure 2:
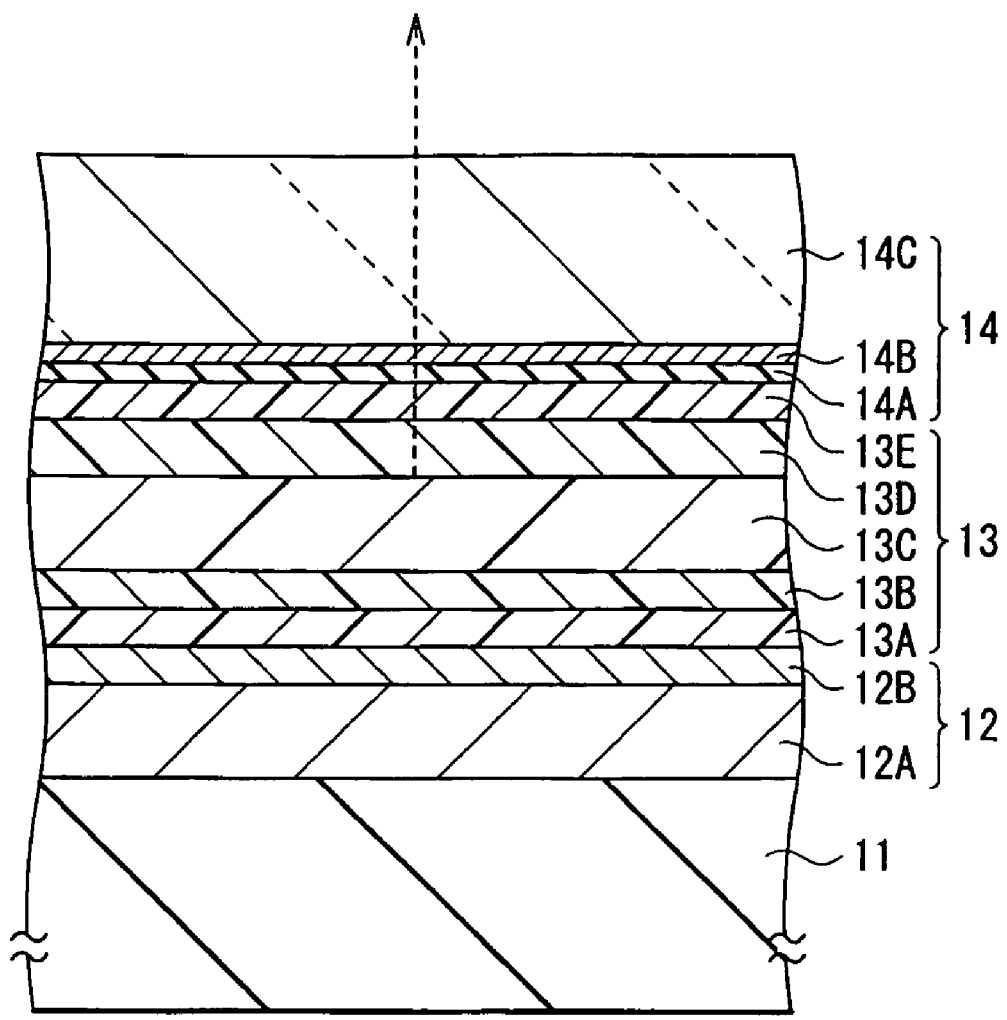
FIG. 2 is a cross section showing a construction of an organic light emitting device shown in FIG. 1.

FIG. 2 shows an example of a construction of the organic light emitting device 10M. The organic light emitting device 10M, for example, has a structure, wherein a first electrode 12 as an anode, an organic layer 13, and a second electrode 14 as a cathode are layered in this order from the driving substrate 11 side. A protective film (not shown) is formed on the second electrode 14 according to needs.

The first electrode 12, for example, has a structure, wherein a reflective layer 12A for reflecting light generated in a light emitting layer and a first transparent electrode 12B transparent to the light generated in the light emitting layer are layered in this order from the driving substrate 11 side. The light generated in the organic light emitting device 10M is reflected by the reflective layer 12A to the color filter 22 side. It is desirable that the reflective layer 12A has high reflectivity as much as possible in order to improve light emitting efficiency. A thickness in the lamination direction (hereinafter simply referred to as thickness) of the reflective layer 12A is, for example, about 50 nm. The reflective layer 12A is made of a simple substance or an alloy of metal elements such as platinum (Pt), gold (Au), silver (Ag), chromium (Cr), and tungsten (W). The first transparent electrode 12B is intended to improve efficiency to inject electron holes into the organic layer 13. The first transparent electrode 12B, is, for example, about 20 nm thick, and is made of a conductive material sufficiently transparent to the light generated in the light emitting layer, such as ITO (Indium Tin Oxide). The first electrode 12 can be constructed from several layers, or can be constructed from a single layer.

The organic layer 13 has a structure, wherein an electron hole injection layer 13A, an electron hole transport layer 13B, a light emitting layer 13C, an electron transport layer 13D, and an electron injection layer 13E are layered in this order from the first electrode 12 side. The electron hole injection layer 13A and the electron hole transport layer 13B are intended to improve efficiency to inject electron holes into the light emitting layer 13C. The light emitting layer 13C is intended to generate light by current injection. The electron transport layer 13D and the electron injection layer 13E are intended to improve efficiency to inject electrons into the light emitting layer 13C.

The electron hole injection layer 13A is, for example, about 20 nm thick, and is made of 4,4',4"-tris(3-methylphenyl phenylamino)triphenylamine (m-MTDATA). The electron hole transport layer 13B is, for example, about 10 nm thick, and is made of bis [(N-naphthyl)-N-phenyl]benzidine ($\alpha$-NPD).

Figure 3:
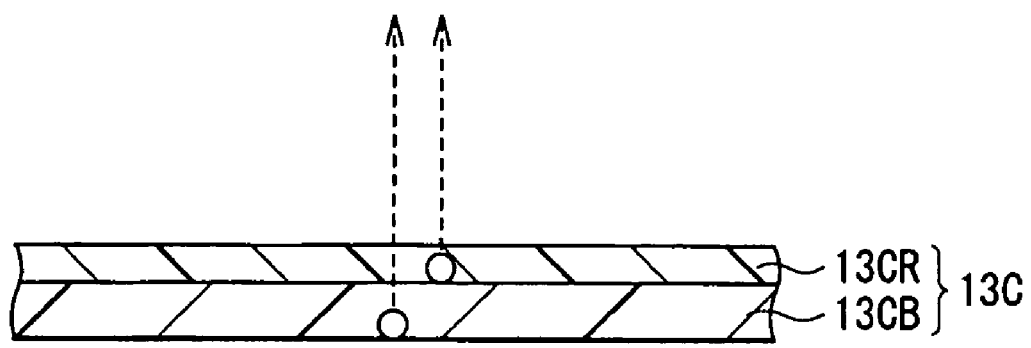
FIG. 3 is a cross section showing a construction of a light emitting layer shown in FIG. 2.

FIG. 3 shows an enlarged view of a construction of the light emitting layer 13C. The light emitting layer 13C, for example, has a structure, wherein a light emitting layer 13CB for emitting blue light and a red light emitting layer 13CR for emitting red light are layered in this order from the first electrode 12 side. The blue light emitting layer 13CB is, for example, about 15 nm thick, and is made of a mixture, wherein 5 volume % of BCzVBi(4,4'-bis(3-carbazolylvinyl) biphenyl is mixed into 4,4'-bis(2,2'-diphenylvinyl) biphenyl (DPVBi). The red light emitting layer 13CR is, for example, about 10 nm thick, and is made of 2,6-bis[(4'-methoxy diphenylamino)styryl]-1,5-dicianonaphthalene (BSN).

The electron transport layer 13D shown in FIG. 2 is, for example, about 30 nm thick, and is made of DPVBi. The electron injection layer 13E shown in FIG. 2 is, for example, about 10 nm thick, and is made of 8-hydroxyquinoline aluminum ($Alq_3$).

The second electrode 14 shown in FIG. 2, for example, has a structure, wherein a buffer layer 14A for improving efficiency to inject electrons into the organic layer 13, an ultrathin transmissive metal electrode 14B transparent to the light generated in the light emitting layer 13C, and a second transparent electrode 14C transparent to the light generated in the light emitting layer 13C are layered in this order from the organic layer 13 side. The buffer layer 14A is, for example, about 0.3 nm thick, and is made of lithium fluoride (LiF). The ultrathin transmissive metal electrode 14B is, for example, about 1 nm thick, and is made of a metal or an alloy such as silver (Ag), aluminum (Al), magnesium (Mg), calcium (Ca), and sodium (Na). As an alloy material, for example, alloy of magnesium (Mg) and silver (Ag) (MgAg alloy) is preferable. The second transparent electrode 14C is intended to lower an electric resistance of the ultrathin transmissive metal electrode 14B. The second transparent electrode 14C is, for example, about 100 nm thick, and is made of a conductive material sufficiently transparent to the light generated in the light emitting layer such as ITO.

The sealing substrate 21 shown in FIG. 1 is located on the organic light emitting device 10M side of the driving panel 10, and seals the organic light emitting device 10M with the adhesive layer 30. The filter layers 22B, 22R, and 22G of the color filter 22 are respectively made of resins mixed with pigments. Adjustment is made so that light transmittance in a target wavelength band of red, green, or blue is high and light transmittance in other wavelength bands is low by selecting pigments. The color filter 22 can be provided on either side of the sealing substrate 21 as long as the color filter 22 is provided in the position facing the organic light emitting device 10M. However, it is preferable that the color filter 22 is provided on the driving panel 10 side, since the color filter 22 is not exposed on the surface and can be protected by the adhesive layer 30.

It is preferable that in the color filter 22, transmittance of respective wavelength components of 455 nm and 630 nm, that is, transmittance of blue and red is 70% or more. The reason thereof is that a loss associated with color separation can be decreased, and light extraction efficiency and luminance can be improved.

The adhesive layer 30 shown in FIG. 1 is preferably made of a thermosetting resin, thermosetting and ultraviolet-curing resin or the like. It is difficult to cure a resin by only ultraviolet irradiation, since the ultraviolet is absorbed by the color filter 22 formed on the sealing panel 20.

Further, the organic light emitting device 10M emits green light at intensity relatively lower than of blue and red, and is provided with a green fluorescence conversion layer 23 for absorbing a blue wavelength component and emitting green light between the organic light emitting device 10M and the green filter layer 22G as shown in FIG. 1. Thereby, in the display device, it is possible to decrease a green light emitting component causing lowering color purity when blue and red are separated, and improve the color purity of blue and red by using the color filter 22 having high transmittance and a low density. In addition, it is possible to complement the decreased green light emitting component with the green fluorescence conversion layer 23, adjust chromaticity by the green filter layer 22G, and improve light emitting efficiency and color reproducibility.

The green fluorescence conversion layer 23 is, for example, about 20 μm, and is made of a mixture, wherein 1 volume % of coumarin 6 is mixed into DPVBi.

Specifically, it is preferable that in the organic light emitting device 10M, emission intensity ratio r shown in Mathematical formula 2 is from 0.1 to 0.45.

$$\text{Emission Intensity Ratio } r = A/B \qquad \text{(Mathematical formula 2)}$$

In Mathematical formula 2, A represents a value obtained by integrating emission intensity of wavelengths from 480 nm to 590 nm in the spectrum of the organic light emitting device 10M, and B represents a value obtained by integrating emission intensity of wavelengths from 420 nm to 680 nm in the spectrum of the organic light emitting device 10M, respectively.

Figure 4:
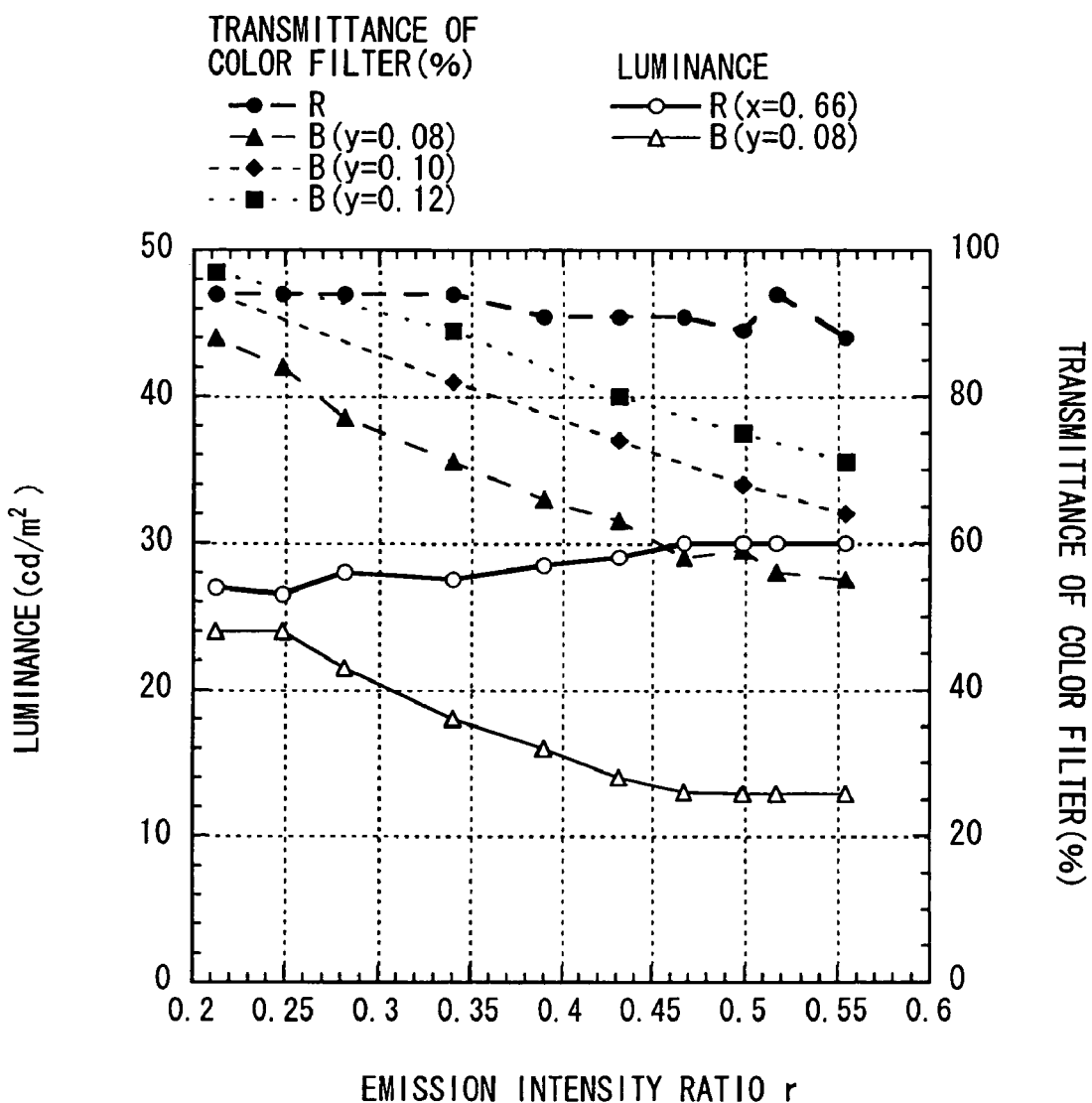
FIG. 4 is a view showing a relation between transmittance (density) of a color filter required for obtaining blue (chromaticity y=0.08) and red (chromaticity x=0.67) and emission intensity ratio r, along with luminance of red and blue.
Figure 5:
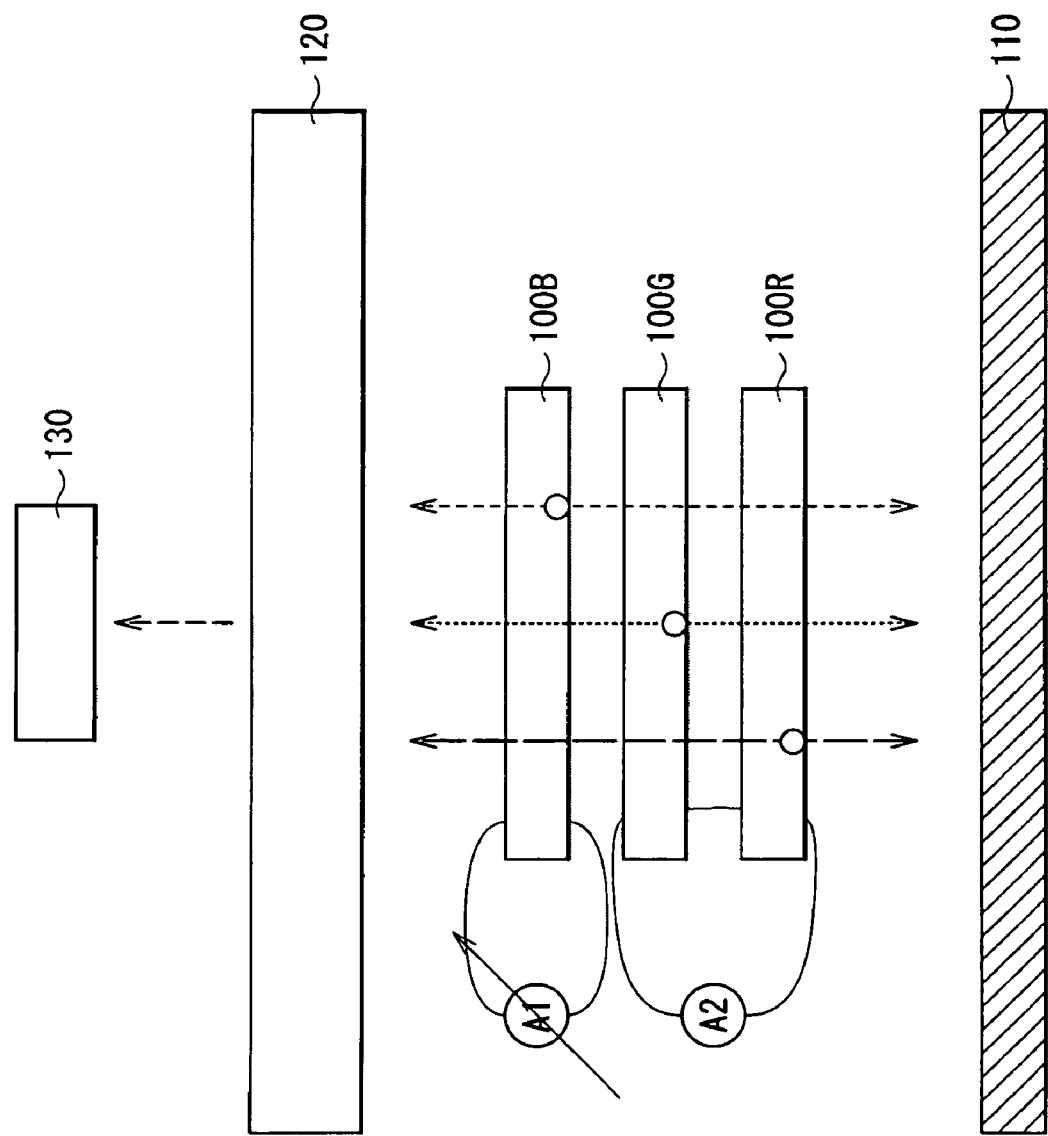
FIG. 5 is a block diagram showing a construction of a measurement system used for measurement of FIG. 4.

FIG. 4 shows a relation between transmittance (density) of the color filter required for obtaining blue (chromaticity y=0.08) and red (chromaticity x=0.67) and the emission intensity ratio r, along with luminance of red and blue. FIG. 4 is a result of a measurement performed by constructing a measurement system as shown in FIG. 5. This measurement system is intended to measure a spectrum after color separation. In this measurement system, a red organic light emitting device 100R for emitting red light, a blue organic light emitting device 100B for emitting blue light, and a green organic light emitting device 100G for emitting green light are layered and arranged between a reflective plate 110 and a color filter 120, and a measuring instrument 130 is arranged on the opposite side of the color filter 120 from these organic light emitting devices. Though not shown, the red organic light emitting device 100R, the green organic light emitting device 100G, and the blue organic light emitting device 100B are transparent devices, wherein an organic layer including a light emitting layer is sandwiched between a transparent anode and a transparent cathode respectively made of ITO. Respective light emitting colors are set to be different from each other by changing constructions and materials of the organic layers of the respective devices.

Figure 6:
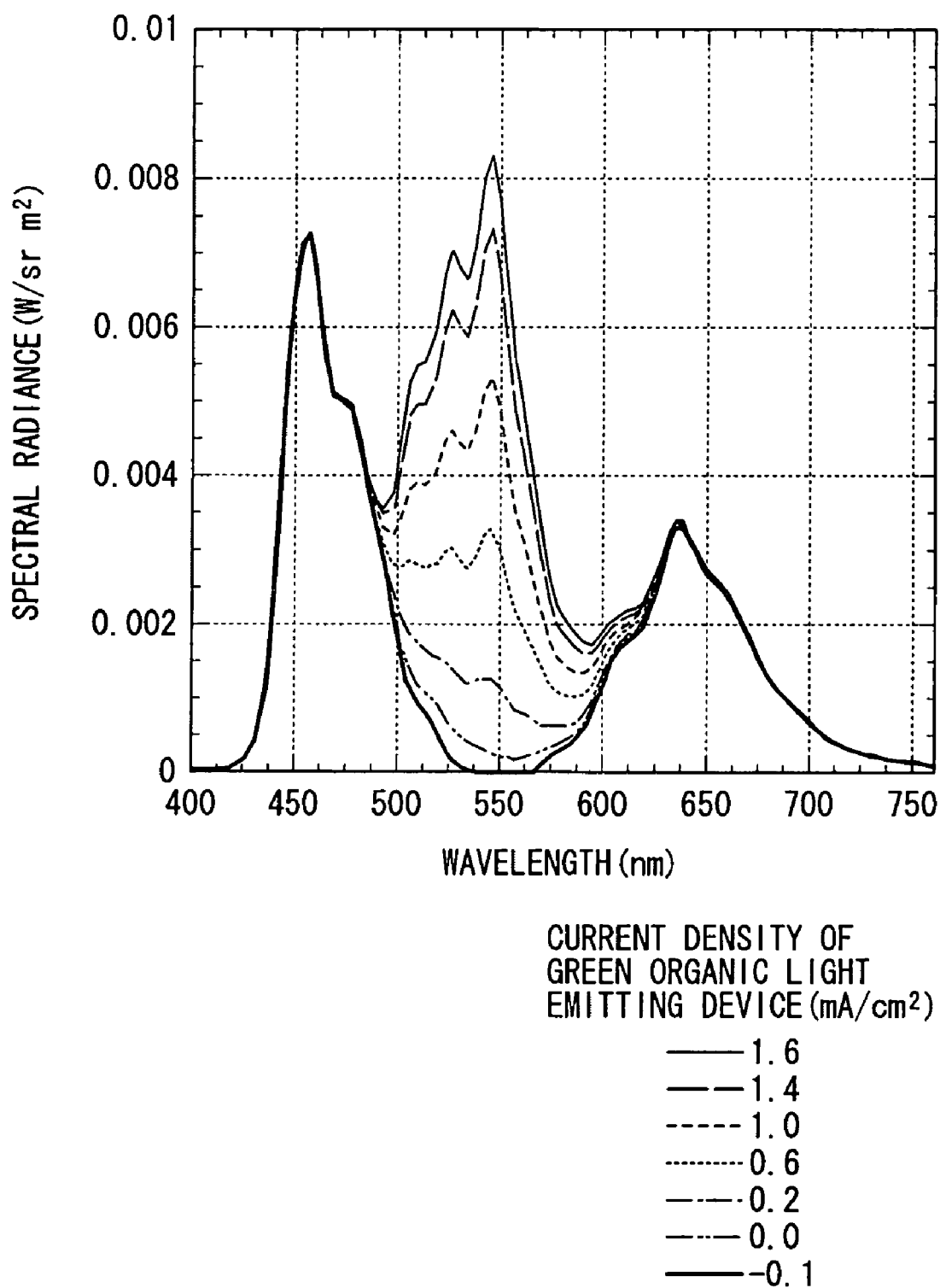
FIG. 6 is a view showing spectrums used for the measurement of FIG. 4.
Figure 7:
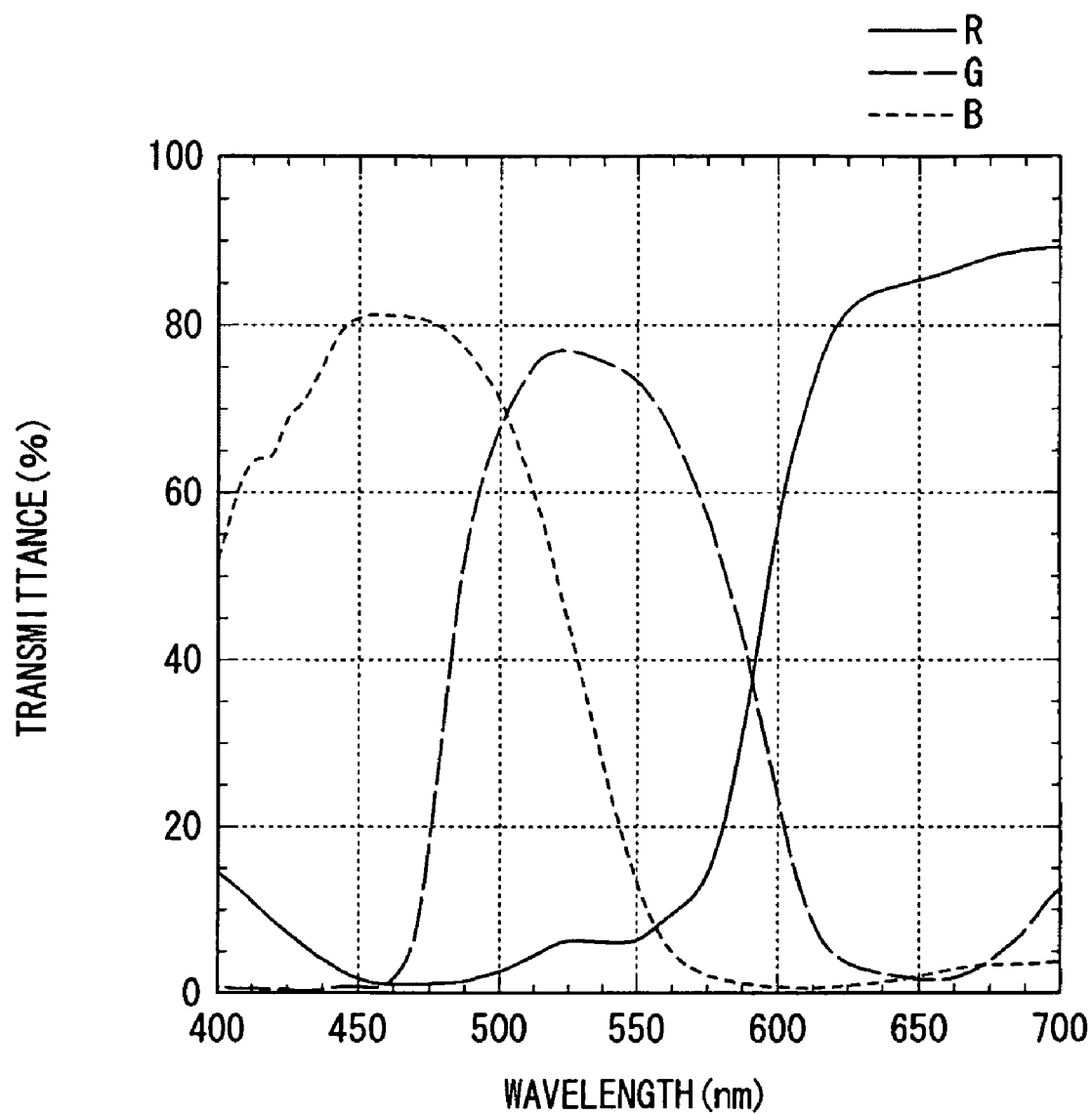
FIG. 7 is a view showing transmission characteristics of the color filter used for the measurement of FIG. 4.

As measurement conditions, a current density applied to the red organic light emitting device 100R and the blue organic light emitting device 100B is fixed to 1 mA/cm$^2$, and a current density applied to the green organic light emitting device 100G is changed, and thereby emission intensity of green in the spectrum entering the color filter 120 is changed as shown in FIG. 6 and thereby the emission intensity ratio r is changed. Regarding each spectrum shown in FIG. 6, necessary degrees of the transmittance (density) of the color filter 120 to obtain blue (chromaticity y=0.08) and red (chromaticity x=0.67) are respectively measured. As the color filter 120, a color filter with transparency characteristics shown in FIG. 7 is used. Target wavelengths are set to 630 nm for red and 455 nm for blue. The transmittance, that is strength as a filter is changed by changing thicknesses. In FIG. 6, only the spectrum having a current density of −0.1 mA/cm$^2$ is obtained by composition with calculation of subtracting from the value of a current density of 0.1 mA/cm$^2$.

As evidenced by FIG. 4, first, focusing attention on blue, in the case of the emission intensity ratio r=0.45, the color filter having transmittance of about 55% should be used, and the obtainable luminance is 13 cd/m$^2$. When r is 0.45 or more, no change is shown. However, the smaller r is (the weaker green is), the lower the density of the required color filter can be, while the luminance is concurrently increased. From the foregoing, it is evident that though the emission intensity of blue of the original spectrum is totally identical as shown in FIG. 6, the luminance of blue after color separation is varied according to a ratio of the green light emitting component included in the spectrum, that is the emission intensity ratio r. Meanwhile, in the case of red, it is evident that the luminance after color separation is not much decreased even when the emission intensity ratio r is changed, and the color filter having transmittance of 80% or more can be always used. That is, when the emission intensity ratio r is set to 0.45 or less, the color filter having high transmittance can be used, color purity of blue can be increased, and decrease of luminance of blue after blue is separated can be small.

It is thinkable that such difference of color separation between blue and red is caused by transmission characteristics of the color filter. As evidenced by FIG. 7, while red can cut the short wavelength component relatively steeply, blue cannot cut the long wavelength component steeply. Therefore, when desired chromaticity is obtained, in the case of blue (a small value such as y=0.08 is preferable), if a wavelength component of 480 nm or more which increases the value of y is included a great deal in the EL light, such a wavelength component should be cut by increasing the density of the color filter. In the result, required transmittance in the vicinity of 455 nm is concurrently decreased. Meanwhile, in the case of red, since the green element can be cut steeply, it is not necessary to increase the density of the color filter even if the emission intensity ratio r is changed.

The emission intensity ratio r can be zero in theory, but is preferably 0.1 or more. As shown in FIG. 6, it is evident that even when the current density of the green organic light emitting device 100G is set to 0.0 mA/cm² (emission intensity ratio r=0.25), and only the blue organic light emitting device 100B and the red organic light emitting device 100R emit light, the emission intensity of green does not become zero.

This display device, can be, for example, manufactured as below.

First, the first electrode 12, the organic layer 13, and the second electrode 14 made of the foregoing materials having the foregoing thicknesses are sequentially deposited over the driving substrate 11 made of the foregoing material by vacuum deposition method, sputtering method or the like. Then, in the case of the vacuum deposition, the pressure is set to $1E^{-4}$ Pa, and deposition is made by resistive heating method. Further, the first transparent electrode 12B and the second transparent electrode 14C respectively made of ITO are deposited by, for example, DC magnetron sputtering method. As deposition conditions thereof, for example, argon (Ar) gas, wherein 1% of oxygen ($O_2$) is mixed is used as sputtering gas, a flow rate is set to 5 sccm, a pressure is set to 0.3 Pa, and an output is set to 150 W. Thereby, the driving panel 10 having the organic light emitting device 10M shown in FIG. 1 is formed.

Next, the filter layers 22B, 22R, and 22G of the color filter 22 are sequentially formed on the sealing substrate 21 made of the foregoing material by, for example, spin coat method, photolithography technique, printing method, vacuum deposition, sputtering method, ink jet coating method or the like. Subsequently, the green fluorescence conversion layer 23 made of the foregoing material having the foregoing thickness is formed on the green filter layer 22G by, for example, spin coat method and photolithography technique, printing method, vacuum deposition, sputtering method, ink jet coating method or the like. Thereby, the sealing panel 20 is formed.

After that, the adhesive layer 30 made of the foregoing material is formed by coating on the side of the driving panel 10 where organic light emitting device 10M is formed. Coating can be performed, for example, by discharging a resin from a slit nozzle type dispenser, by roll coating, or by screen printing. Subsequently, as shown in FIG. 1, the driving panel 10 and the sealing panel 20 are bonded together with the adhesive layer 30 in between. Then, a face of the sealing panel 20 where the color filter 22 is formed is preferably arranged facing the driving panel 10. Further, it is preferable that air bubbles or the like do not mix in the adhesive layer 30. After that, relative positions of the color filter 22 of the sealing panel 20 and the organic light emitting device 10M of the driving panel 10 are aligned, and then the adhesive layer 30 is cured. Consequently, the display device shown in FIGS. 1 to 3 is completed.

In this display device, when a given voltage is applied between the first electrode 12 and the second electrode 14, a current is injected into the red light emitting layer 13CR and the blue light emitting layer 13CB of the organic layer 13, and an electron hole and an electron recombine, and thereby red light is generated in the red light emitting layer 13CR and blue light is generated in the blue light emitting layer 13CB, and these red and blue light pass through the second electrode 14, the adhesive layer 30, and the sealing panel 20 and extracted. Here, the organic light emitting device 10M emits green light at intensity relatively lower than blue light and red light. Therefore, the green light emitting component causing decrease of color purity when color separation for blue and red is performed in the color filter 22 becomes decreased. In the result, even if the color filter 22 having high transmittance and low density is used, high color purity can be obtained, and color separation characteristics of blue and red are improved. Further, the decreased green light emitting component is complemented with the green fluorescence conversion layer 23, and chromaticity is adjusted by the green filter layer 22G.

As above, in this embodiment, EL light emission of green in the organic light emitting device 10M has intensity relatively lower than blue and red. Therefore, it becomes possible that the green EL light emitting component causing decrease of color purity when color separation for blue and red is performed in the color filter 22 is decreased, and the color filter 22 having high transmittance and low density is used to improve color purity of blue and red. Further, efficiency of color separation of blue and red can be improved. In particular, it is effective for blue, since transmission characteristics of the color filter of blue are not idealistic. Further, energy of the decreased green EL light emitting component is distributed to blue and red. Therefore, total efficiency can be improved by concurrently using the color filter 22 having high transmittance. Further, regarding green, the green fluorescence conversion layer 23 for absorbing the wavelength component of blue and emitting green light is provided between the organic light emitting device 10M and the green filter layer 22G of the color filter. Therefore, the decreased green EL light emitting component can be complemented with the green fluorescence conversion layer 23, and chromaticity can be adjusted by the green filter layer 22G. Since the green fluorescence conversion layer 23 has high conversion efficiency, luminance of green can be also improved. Consequently, the display device having high efficiency and superior color reproducibility can be constructed. In addition, as conventional display devices, a sufficient length of luminance half period, the characteristics for multi light emission or white light emission can be maintained, and the longer lasting display device can be obtained. Further, deterioration of the green fluorescence conversion layer 23 is small, which can be ignored.

Second Embodiment

Figure 8:
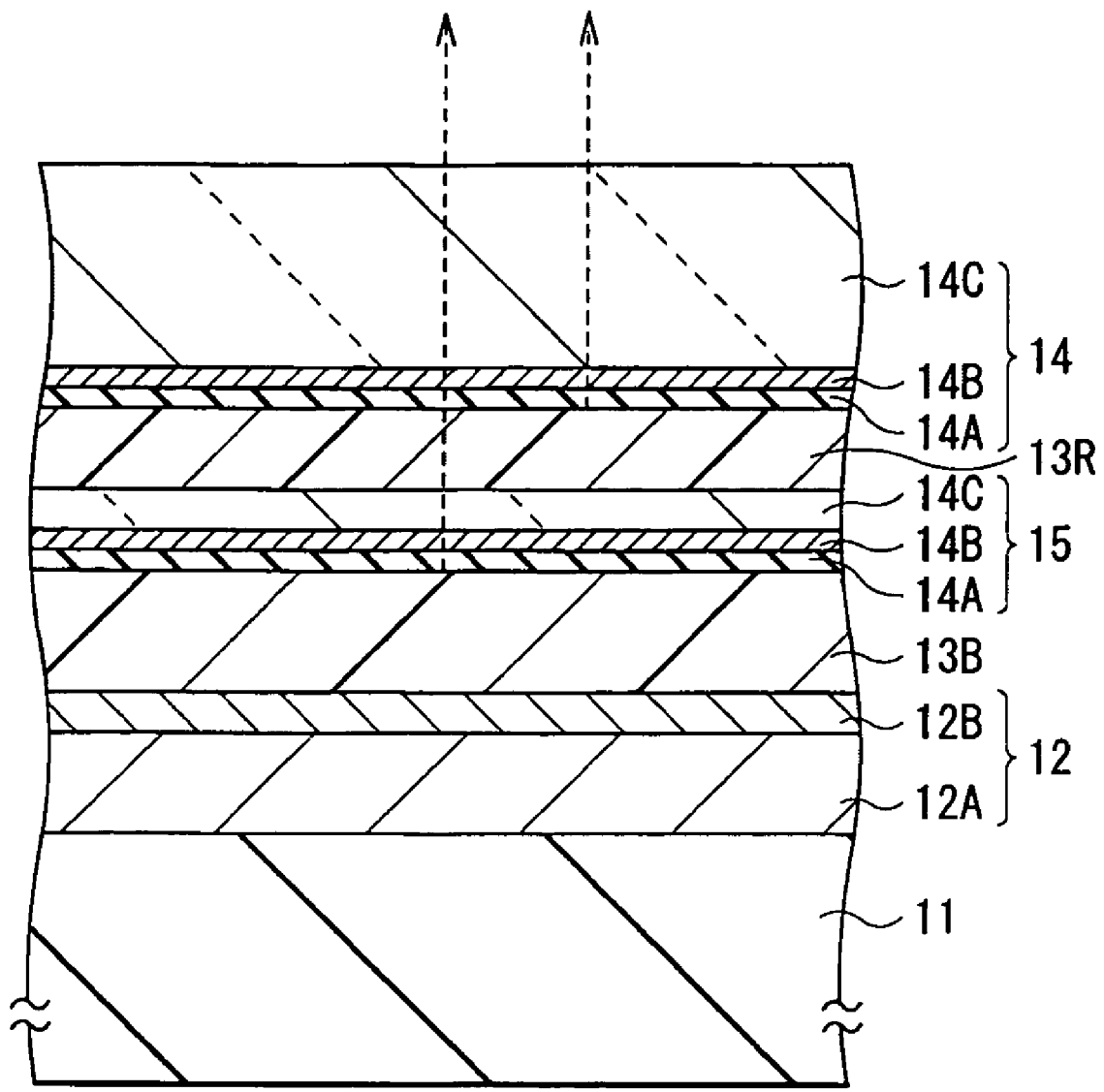
FIG. 8 is a cross section showing a construction of a display device according to a second embodiment of the invention.

FIG. 8 shows a construction of an organic light emitting device of a display device according to a second embodiment of the invention. This display device is identical with the display device described in the first embodiment except that this display device comprises a so-called tandem organic light emitting device, wherein the first electrode 12, a blue organic layer 13B including a blue light emitting layer, an intermediate electrode 15, a red organic layer 13R including a red light emitting layer, and the second electrode 14 are layered in this order from the driving substrate 11 side on the driving substrate 11. Therefore, descriptions will be given by applying the same symbols to the same components.

The tandem organic light emitting device is electrically equal to a combination, wherein a red organic light emitting device and a blue organic light emitting device are connected in series. Therefore, light emitting efficiency per current is twice as high as general efficiency. However, its driving voltage is also twice as high as a general driving voltage, and therefore efficiency per power is not changed. However, since a driving current value can be reduced by half and thereby a luminance half period becomes long, this tandem organic light emitting device currently attracts attention.

Figure 9:
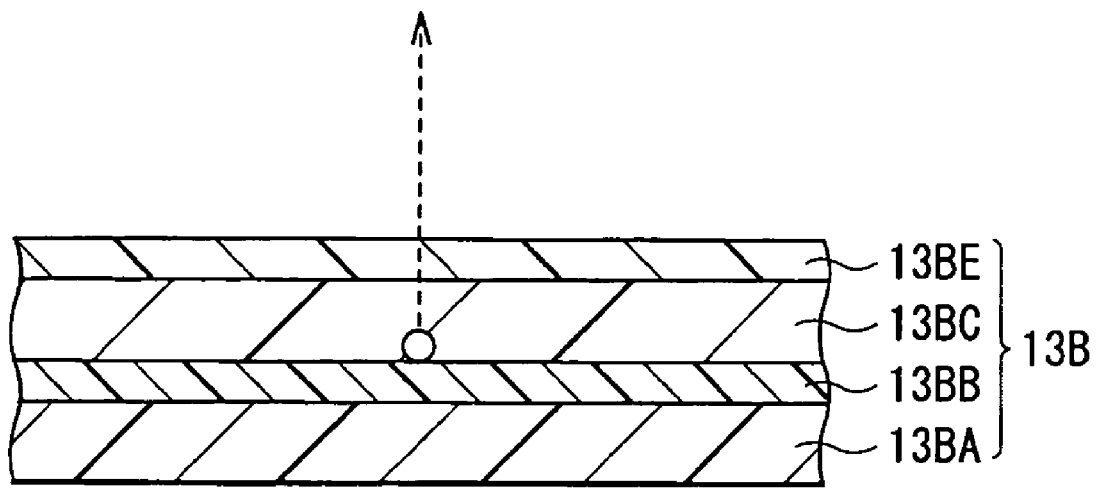
FIG. 9 is a cross section showing a construction of a blue organic layer shown in FIG. 8.

The blue organic layer 13B, for example, as shown in FIG. 9, has a structure, wherein an electron hole injection layer 13BA, an electron hole transport layer 13BB, a blue light emitting layer 13BC, and an electron injection layer 13BE are layered in this order from the first electrode 12 side. The electron hole injection layer 13BA is, for example, about 20 nm thick, and is made of m-MTDATA. The electron hole transport layer 13BB is, for example, about 10 nm thick, and is made of α-NPD. The blue light emitting layer 13BC is, for example, about 20 nm thick, and is made of a mixture, wherein 5 volume % of BCzVBi is mixed into DPVBi. The electron injection layer 13BE is, for example, about 8 nm thick, and is made of Alq$_3$.

The intermediate electrode 15, for example, similarly to the second electrode 14, has a structure, wherein the buffer layer 14A, the ultrathin transmissive metal electrode 14B, the second transparent electrode 14C are layered in this order from the blue organic layer 13B side. The buffer layer 14A and the ultrathin transmissive metal electrode 14B are constructed as in the second electrode 14. The second transparent electrode 14C is constructed as in the second electrode 14, except that the thickness is, for example, about 10 nm.

Figure 10:
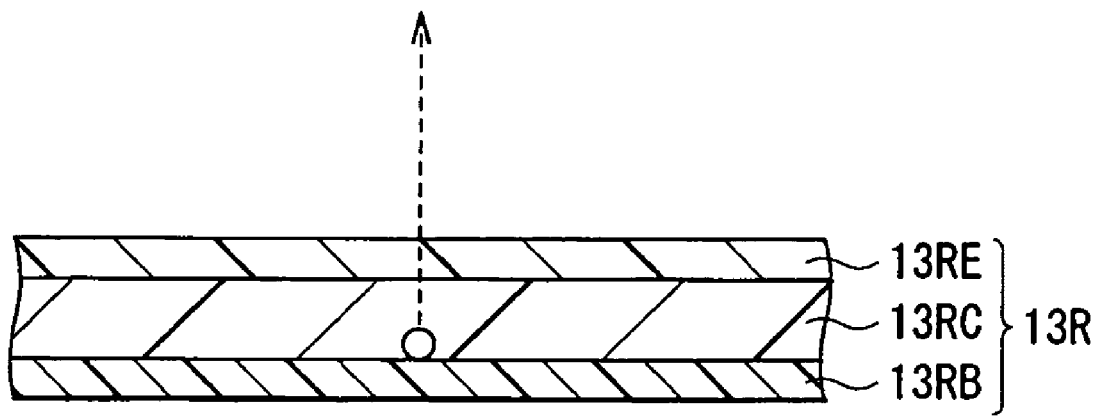
FIG. 10 is a cross section showing a construction of a red organic layer shown in FIG. 8.

The red organic layer 13R, for example, as shown in FIG. 10, has a structure, wherein an electron hole transport layer 13RB, a red light emitting layer 13RC, and an electron injection layer 13RE are layered in this order from the first electrode 12 side. The electron hole transport layer 13RB is, for example, about 10 nm thick, and is made of α-NPD. The red light emitting layer 13RC is, for example, about 20 nm thick, and is made of BSN. The electron injection layer 13RE is, for example, about 8 nm thick, and is made of Alq$_3$.

This display device can be manufactured as in the first embodiment. Operations and effects thereof are similar to of the first embodiment.

Third Embodiment

Figure 11:
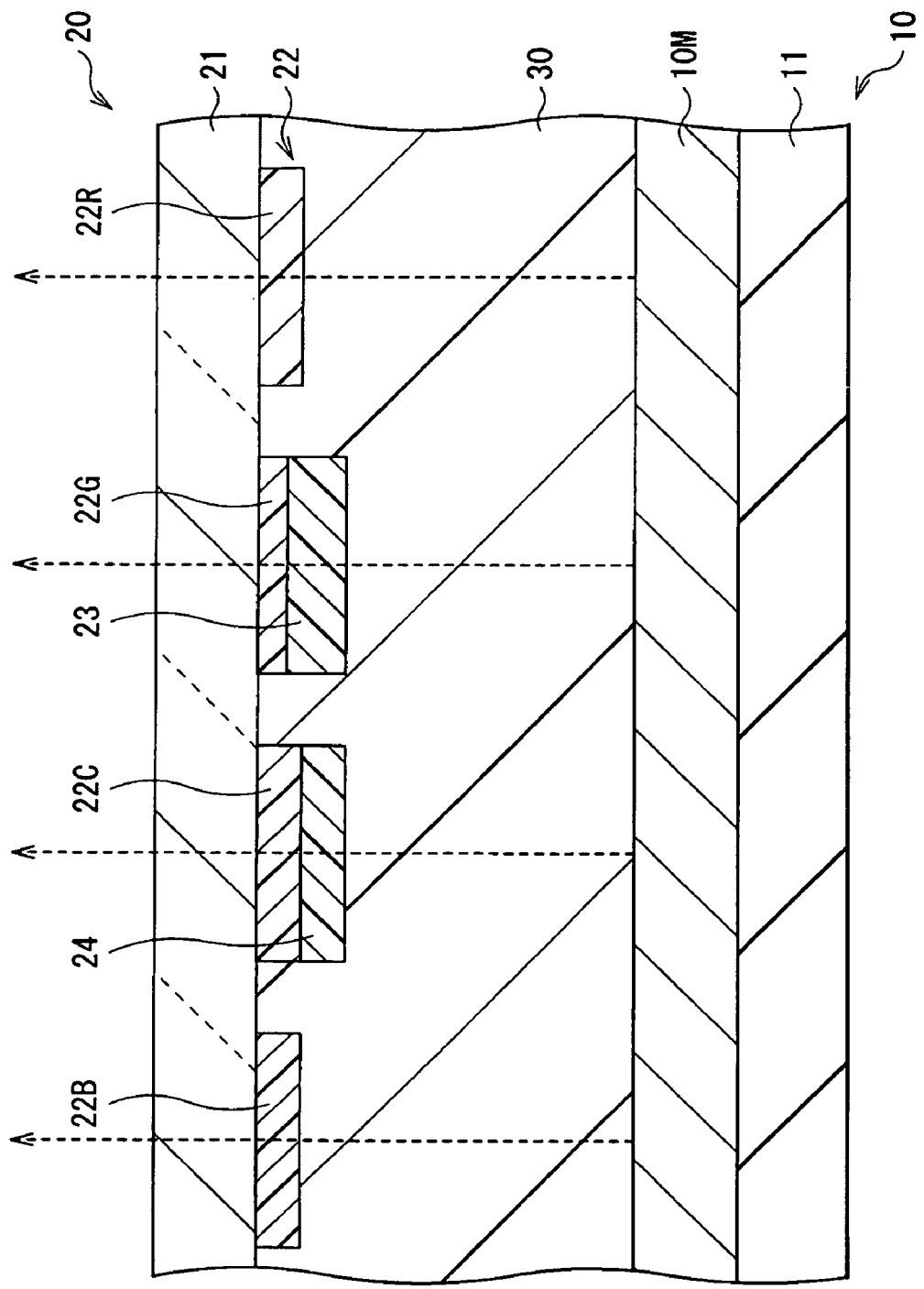
FIG. 11 is a cross section showing a construction of a display device according to a third embodiment of the invention.

FIG. 11 shows a cross sectional structure of a display device according to a third embodiment of the invention. This display device is identical with the display device described in the first embodiment, except that this display device has a filter layer 22C of cyan in addition to the filter layers 22B, 22R, and 22G of three colors, blue, red, and green, and comprises a cyan fluorescence conversion layer 24 between the organic light emitting device 10M and the filter layer 22C of cyan. Therefore, the same symbols are applied to the same components, and descriptions thereof will be omitted.

The cyan fluorescence conversion layer 24 is intended to absorb a blue wavelength component and emit cyan light. The filter layer 22C of cyan is intended to adjust chromaticity of light which is converted into cyan by the cyan fluorescence conversion layer 24, and is made of a resin mixed with a pigment as in the filter layers 22B, 22R, and 22G. In this display device, since the filter layer 22C of cyan and the cyan fluorescence conversion layer 24 are provided, four primary color display of red, green, blue, and cyan is enabled, and color reproducibility and expressivity as a display unit can be improved facing up to the future high-definition display.

This display device can be manufactured as in the first embodiment, except that in a step of forming the sealing panel 20, the filter layer 22C of cyan is formed on the sealing substrate 21 in addition to the filter layers 22B, 22R, and 22G, and the cyan fluorescence conversion layer 24 is formed on the filter layer 22C of cyan by, for example, spin coat method and photolithography technique, printing method, vacuum deposition, sputtering method, ink jet coating method or the like.

In this display device, for example, as in the first embodiment, when a given voltage is applied between the first electrode 12 and the second electrode 14, a current is injected into the red light emitting layer 13CR and the blue light emitting layer 13CB of the organic layer 13, and an electron hole and an electron recombine, and thereby red light is generated in the red light emitting layer 13CR and blue light is generated in the blue light emitting layer 13CB, and these red and blue light pass through the second electrode 14, the adhesive layer 30, and the sealing panel 20 and extracted. Here, since the filter layer 22C of cyan and the cyan fluorescence conversion layer 24 are provided, part of blue light is absorbed into the cyan fluorescence conversion layer 24 and then converted to cyan, chromaticity is adjusted by the filter layer 22C of cyan, and thereby four primary color display of blue, red, green, and cyan is performed. Since this cyan is obtained by fluorescence conversion, color separation of the blue component is not affected thereby.

This embodiment is provided with the filter layer 22C of cyan in addition to the filter layers 22B, 22R, and 22G of three colors, and comprises the cyan fluorescence conversion layer 24. Therefore, in addition to the effects of the first embodiment, four primary color display of red, green, blue, and cyan can be performed, and color reproducibility and expressivity as a display unit can be improved facing up to the future high-definition display. Further, since this cyan is obtained by the fluorescence conversion, color separation of the blue component is not affected thereby. The filter layer 22C of cyan and the cyan fluorescence conversion layer 24 can be easily formed by photo process without using mask deposition. Therefore, the four primary color display can be easily realized by simplified steps.

Fourth Embodiment

Figure 12:
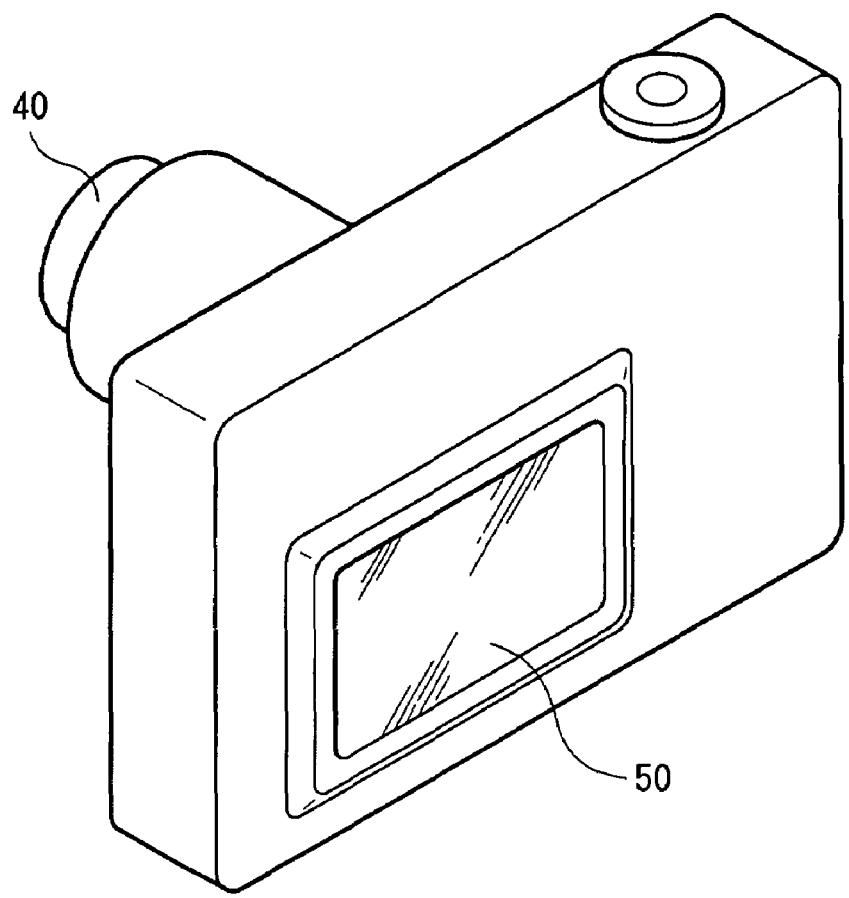
FIG. 12 is a perspective view showing an appearance of an imaging device according to a fourth embodiment of the invention.
Figure 13:
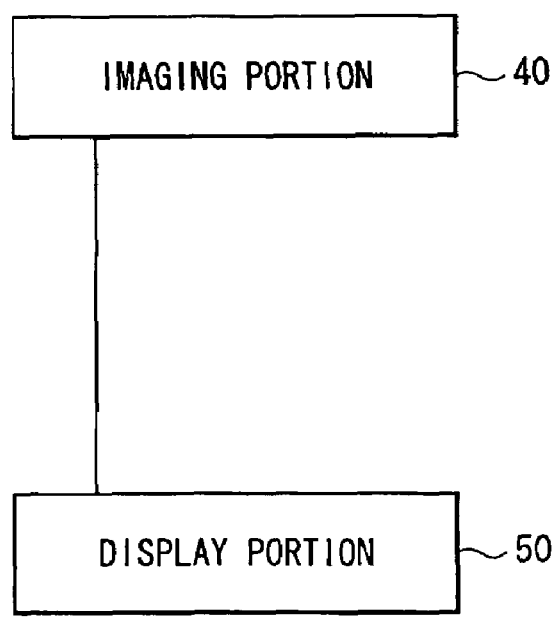
FIG. 13 is a block diagram showing a construction of the imaging device shown in FIG. 12.

FIG. 12 shows an appearance of an imaging device according to the invention. FIG. 13 shows an outline construction of this imaging device. This imaging device is used as, for example, a digital still camera. The imaging device includes an imaging portion 40 for shooting an image, and a display portion 50 for displaying the image shot by the imaging portion 40. The imaging portion 40 and the display portion 50 are connected with a wire or without wire.

The imaging portion 40 comprises a lens (not shown) and an image sensor part (not shown) constructed from a charge transfer type CCD (Charge Coupled Device) image sensor, a CMOS (Complementary Metal Oxide Semiconductor) image sensor for reading by addressing X-Y or the like. The image sensor part is capable of four primary color imaging of blue, red, green, and cyan.

The display portion 50 is constructed from, for example, an organic light emitting display unit comprising the display device having the filter layer 22C of cyan and the cyan fluorescence conversion layer 24 described in the third embodiment for every pixel. Thereby, in this imaging device, the image, which is four-primary-color-imaged by the imaging portion 40 can be truly reproduced on the display portion 50 with four primary color display and good color reproducibility, and expressivity can be improved.

As above, in this embodiment, the imaging device comprises the display portion 50 constructed from the display device of the invention. Therefore, the image imaged by the imaging portion 40 can be truly reproduced with good color reproducibility, and expressivity can be improved.

In this embodiment, the display portion 50 can be constructed from an organic light emitting display unit comprising the display device described in the first embodiment or the second embodiment for every pixel.

EXAMPLES

Further, specific examples of the invention will be hereinafter described in detail.

Example 1

A display device was fabricated as in the first embodiment. First, the organic light emitting device 10M, wherein the first electrode 12, the organic layer 13, and the second electrode 14 were sequentially layered was fabricated on the driving substrate 11 made of glass. Then, the first electrode 12 had a construction, wherein the reflective layer 12A made of chromium (Cr) being 50 nm thick and the first transparent electrode 12B made of ITO being 20 nm thick were sequentially layered from the driving substrate 11 side. The organic layer 13 had a construction, wherein, the electron hole injection layer 13A made of m-MTDATA being 20 nm thick, the electron hole transport layer 13B made of α-NPD being 10 nm thick, the blue light emitting layer 13CB made of a mixture, wherein 5 volume % of BCzVBi was mixed into DPVBi being 15 nm thick, the red light emitting layer 13CR made of BSN being 10 nm thick, the electron transport layer 13D made of DPVBi being 30 nm thick, and the electron injection layer 13E made of $Alq_3$ being 10 nm thick were sequentially layered from the first electrode 12 side. The second electrode 14 had a construction, wherein the buffer layer 14A made of lithium fluoride (LiF) being 0.3 nm thick, the ultrathin transmissive metal electrode 14B made of MgAg alloy being 1 nm thick, and the second transparent electrode 14C made of ITO being 100 nm thick were sequentially layered from the organic layer 13 side. Next, the color filter 22 and the green fluorescence conversion layer 23 were formed on the sealing substrate 21. The green fluorescence conversion layer 23 was 20 μm thick, and was made of a mixture, wherein 1 volume % of coumarin 6 was mixed into DPVBi.

Figure 14:
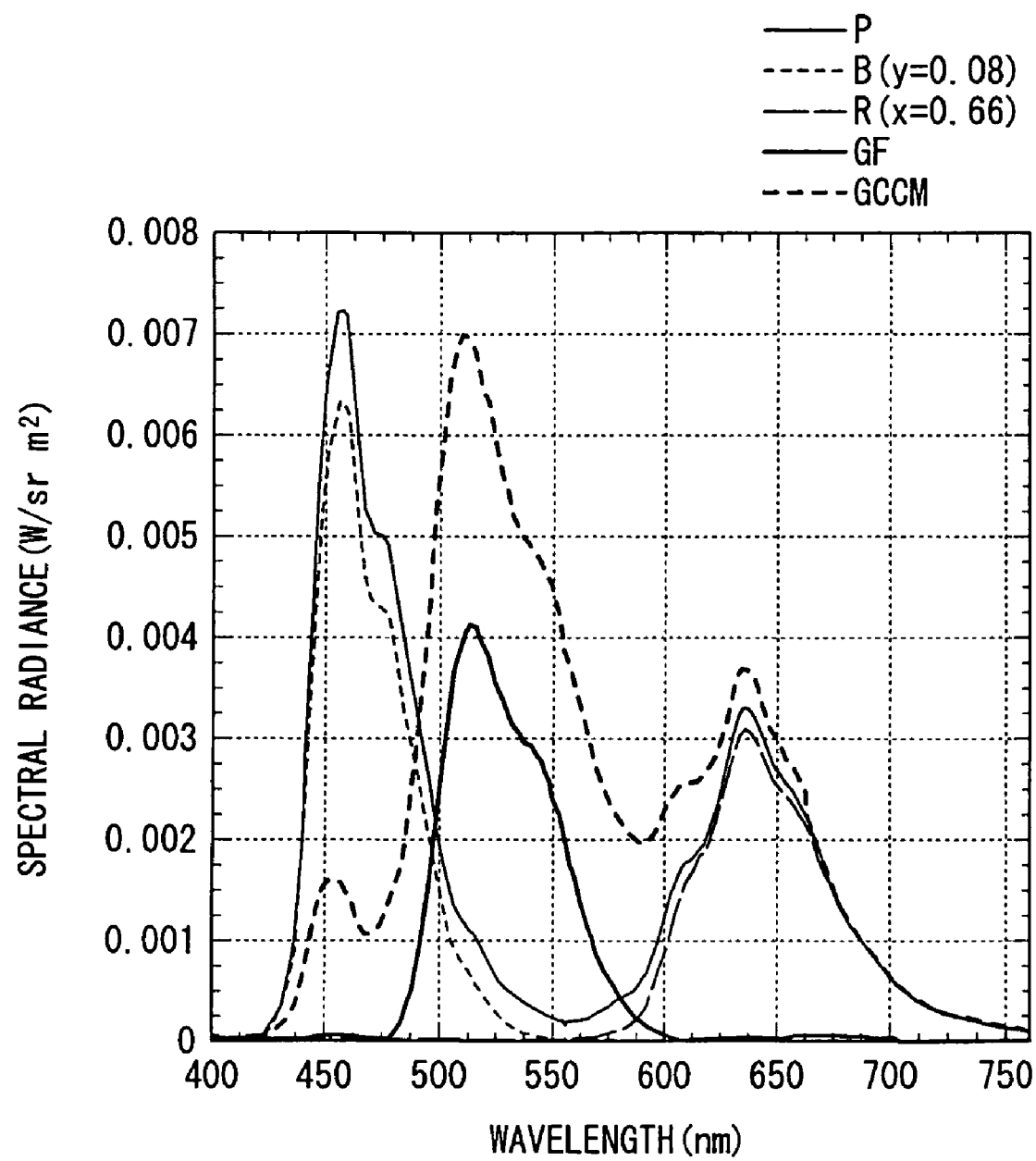
FIG. 14 is a view showing spectrums of a display device of Example 1 of the invention.

Regarding the obtained organic light emitting device 10M, a spectrum was measured. Measurement conditions were a current density of 1 $mA/cm^2$ and 4.5 V. The obtained spectrum P is shown in FIG. 14. Since this organic light emitting device 10M generates only red and blue, pink light emission was obtained. When the emission intensity ratio r of this spectrum was obtained by Mathematical formula 2, r was 0.212.

Further, the blue filter layer 22B was combined with the organic light emitting device 10M to obtain chromaticity y=0.08. Spectrum B when transmittance of the blue filter layer 22B was 85% is also shown in FIG. 14, and chromaticity coordinates and luminance are shown in Table 1.

TABLE 1

| | Chromaticity coordinates | | Luminance L |
|---|---|---|---|
| | X | Y | (cd/m²) |
| B | 0.134 | 0.080 | 24 |
| G | 0.202 | 0.710 | 110 |
| R | 0.670 | 0.300 | 30 |

Further, the red filter layer 22R was combined with the organic light emitting device 10M to obtain chromaticity x=0.67. Spectrum R when transmittance of the red filter layer 22R was 85% is also shown in FIG. 14, and chromaticity coordinates and luminance are also shown in Table 1.

Further, spectrum GF when the green filter layer 22G was combined with the organic light emitting device 10M and green was extracted is also shown in FIG. 14. Further, spectrum GCCM when the green filter layer 22G and the green fluorescence conversion layer 23 were combined with the organic light emitting device 10M is also shown in FIG. 14, and chromaticity coordinates and luminance are also shown in Table 1.

When a luminance half period of this organic light emitting device 10 M was measured, 600 hr was obtained when a current density was 100 $mA/cm^2$ and average luminance in white was 6000 $cd/m^2$.

As evidenced by FIG. 14 and Table 1, regarding the spectrums, the chromaticity, and the luminance of blue and red, good results could be obtained. Regarding green, in spite that the emission intensity ratio r was small, the sufficient luminance was obtained by high conversion efficiency of the green fluorescence conversion layer 23. That is, it was found that when the emission intensity ratio r was set to 0.212 and intensity of the light emission of green was set to relatively lower than those of blue and red, and the green fluorescence conversion layer 23 was provided, color purity and luminance of blue and red could be improved by using the color filter 22 having high transmittance and low density, and the decreased green light emitting component could be complemented with the green fluorescence conversion layer 23 and chromaticity could be adjusted by the green filter layer 22G.

Example 2

A display device was fabricated as in the second embodiment. The tandem organic light emitting device 10M, wherein the first electrode 12, the blue organic layer 13B including the blue light emitting layer 13BC, the intermediate electrode 15, the red organic layer 13R including the red light emitting layer 13RC, and the second electrode 14 were sequentially layered from the driving substrate 11 side was formed on the driving substrate 11. Then, the blue organic layer 13B had a construction, wherein the electron hole injection layer 13BA made of m-MTDATA being 20 nm thick, the electron hole transport layer 13BB made of α-NPD being 10 nm thick, the blue light emitting layer 13BC made of a mixture, wherein 5 volume % of BCzVBi was mixed into DPVBi being 20 nm thick, and the electron injection layer 13BE made of $Alq_3$ being 8 nm thick were sequentially layered from the first electrode 12 side. The intermediate electrode 15 was constructed as in the second electrode 14, except that the second transparent electrode 14C was 10 nm thick. The red organic layer 13R had a construction, wherein the electron hole transport layer 13RB made of α-NPD being 10 nm thick, the red light emitting layer 13RC made of BSN being 20 nm thick, and the electron injection layer 13RE made of $Alq_3$ being 8 nm thick were sequentially layered from the intermediate electrode 15 side. The first electrode 12 and the second electrode 14 were constructed as in Example 1. Next, the color filter 22 and the green fluorescence conversion layer 23 were formed on the sealing substrate 21 as in Example 1.

Regarding the obtained organic light emitting device 10M, a spectrum was measured, and a result as in Example 1 was obtained. Measurement conditions were a current density of 1 $mA/cm^2$ and 9.0 V. Emission intensity then was about twice as large as of Example 1. Further, when the emission intensity ratio r of this spectrum was obtained by Mathematical formula 2, r was 0.252.

Further, the blue filter layer 22B was combined with the organic light emitting device 10M to obtain chromaticity y=0.08. When transmittance of the blue filter layer 22B was 82%, spectrum B as in Example 1 was obtained.

Further, the red filter layer 22R was combined with the organic light emitting device 10M to obtain chromaticity x=0.67. Transmittance of the red filter layer 22R then was 82%.

Further, spectrum GF when the green filter layer 22G was combined with the organic light emitting device 10M and green was extracted, and spectrum GCCM when the green filter layer 22G and the green fluorescence conversion layer 23 were combined with the organic light emitting device 10M were respectively measured. Then, results as in Example 1 were obtained.

When chromaticity of this organic light emitting device 10M was measured, results equal to of Example 1 were obtained for all colors. Luminance under the conditions of a current density of 1 mA/cm$^2$ and 9.0 V was 45 cd/m$^2$ for blue, 210 cd/m$^2$ for green, and 65 cd/m$^2$ for red. That is, efficiency per current became twice as high as in Example 1.

Further, when an luminance half period of this organic light emitting device 10M was measured, 1000 hr was obtained when a current density was 55 mA/cm$^2$ and average luminance in white was 6000 cd/m$^2$.

As evidenced by the foregoing results, regarding the spectrums, the chromaticity, and the luminance, good results were obtained in Example 2 as in Example 1. That is, it was found that when the emission intensity ratio r was set to 0.252 and intensity of light emission of green was set to relatively lower than of blue and red, and the green fluorescence conversion layer 23 was provided, color purity and luminance of blue and red could be improved by using the color filter 22 having high transmittance and low density, and the decreased green light emitting component could be complemented with the green fluorescence conversion layer 23 and chromaticity could be adjusted by the green filter layer 22G. Further, since the organic light emitting device 10M had the tandem structure, even if the initial luminance was the same, the current value could be reduced and the luminance half period could be expanded.

Comparative Example 1

A display device was fabricated as in Example 1, except that the green fluorescence conversion layer was not provided. Regarding an obtained organic light emitting device, a spectrum was measured. Further, as in Example 1, blue, red, and green were separated, and respective spectrums, chromaticity, and luminance were measured. These results are shown in FIG. 15 and Table 2.

TABLE 2

| | Chromaticity coordinates | | Luminance L |
|---|---|---|---|
| | X | Y | (cd/m$^2$) |
| B | 0.134 | 0.080 | 24 |
| G | 0.214 | 0.406 | 110 |
| R | 0.670 | 0.300 | 26 |

Figure 15:
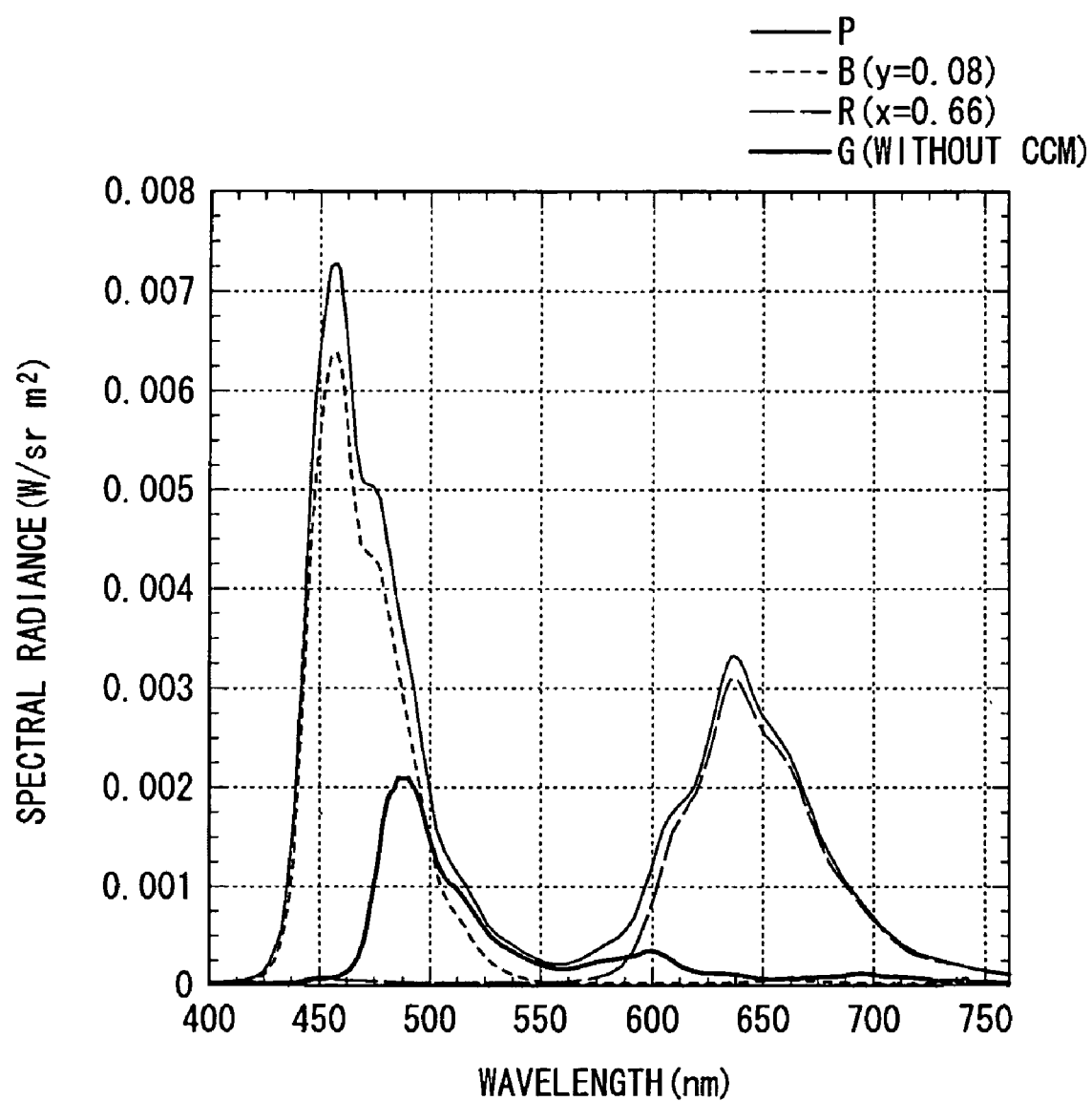
FIG. 15 is a view showing spectrums of a display device of Comparative example 1 of the invention.

As evidenced by FIG. 15 and Table 2, as in Example 1, regarding the spectrums, the chromaticity, and the luminance of blue and red, good results were obtained. However, sufficient chromaticity could not been obtained for green. It is thinkable that the reason thereof is that the green fluorescence conversion layer was not provided.

In the following Comparative examples 2 and 3, cases that the emission intensity ratio r was changed by changing constructions of the light emitting layer of the organic light emitting device.

Comparative Example 2

A display device was fabricated as in Example 1, except that the construction of the light emitting layer of the organic light emitting device was different. Then, the light emitting layer had a construction, wherein a blue light emitting layer made of a mixture, wherein 5 volume % of BCzVBi was mixed into DPVBi being 9 nm thick, a green light emitting layer made of a mixture, wherein 1 volume % of coumarin 6 was mixed into DPVBi being 3 nm thick, and a red light emitting layer made of BSN being 10 nm thick were sequentially layered from the first electrode side. That is, in this comparative example, a three band white organic light emitting device having each peak of R, G, and B was fabricated as an organic light emitting device.

Figure 16:
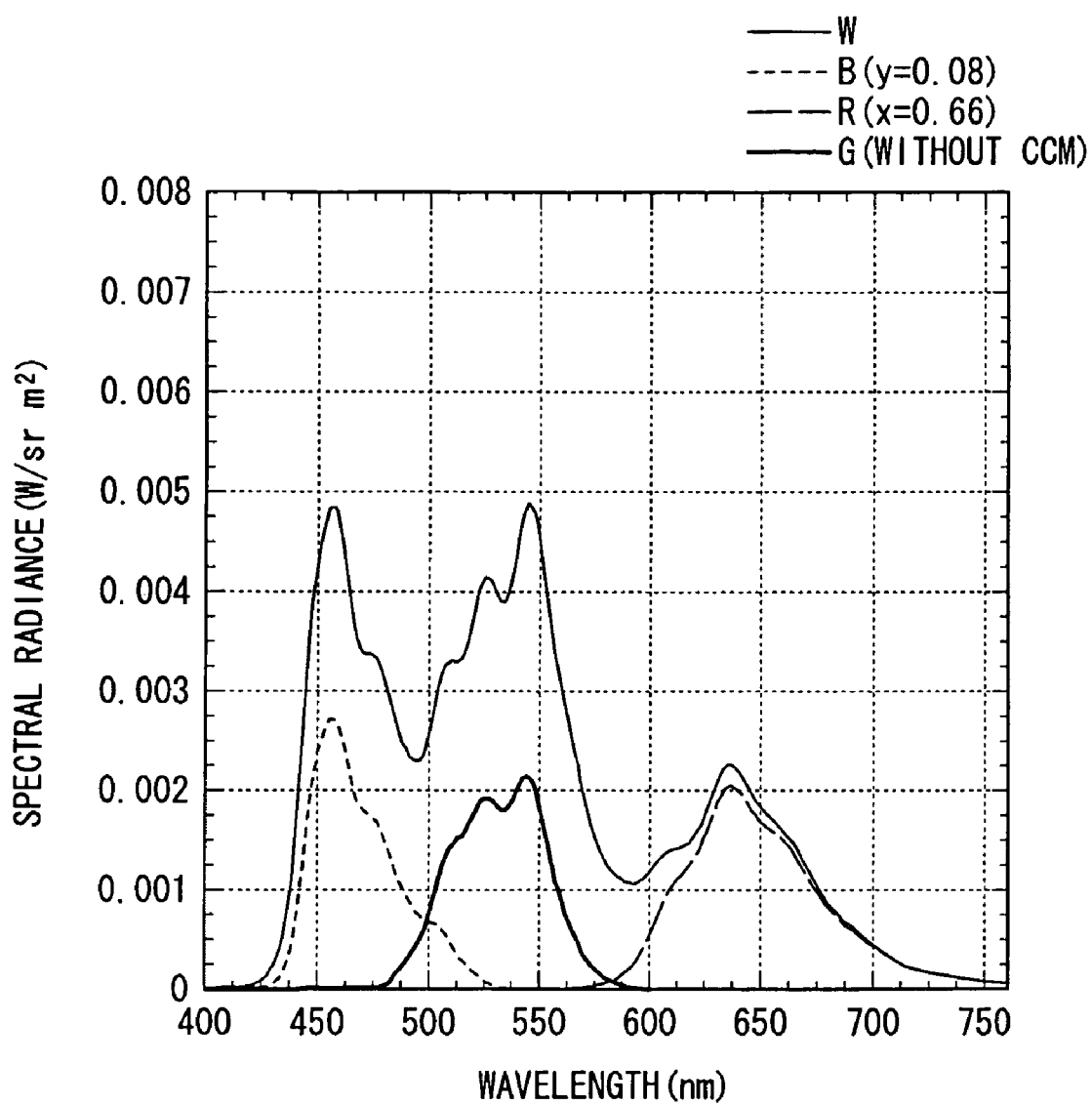
FIG. 16 is a view showing spectrums of a display device of Comparative example 2 of the invention.

Regarding the obtained organic light emitting device, a spectrum was measured. Measurement conditions were a current density of 1 mA/cm$^2$ and 5.2 V. The obtained spectrum W is shown in FIG. 16. Further, when the emission intensity ratio r of this spectrum was obtained by Mathematical formula 2, r was 0.516.

Further, a blue filter layer was combined with this organic light emitting device to obtain chromaticity y=0.08. Spectrum B when transmittance of the blue filter layer was 62% is also shown in FIG. 16, and chromaticity coordinates and luminance are shown in Table 3.

TABLE 3

| | Chromaticity coordinates | | Luminance L |
|---|---|---|---|
| | X | Y | (cd/m$^2$) |
| B | 0.132 | 0.080 | 10 |
| G | 0.217 | 0.710 | 60 |
| R | 0.670 | 0.314 | 19 |

Further, a red filter layer was combined with this organic light emitting device to obtain chromaticity x=0.67. Spectrum R when transmittance of the red filter layer was 83% is also shown in FIG. 16, and the chromaticity coordinates and luminance are also shown in Table 3.

Further, spectrum GF when a green filter layer was combined with this organic light emitting device and green was extracted is also shown in FIG. 16. Transmittance of the filter layer was 53%. Further, chromaticity coordinates and luminance are also shown in Table 3.

As evidenced by FIG. 16 and Table 3, the obtained luminance under a current value of 1 mA/cm$^2$ was only about half of in Example 1. The reason thereof was that since the spectrum W having the large emitting intensity ratio r, 0.516 was used, transmittance of the color filter was decreased. Another reason thereof was that light emitting energy was dispersed into three light emissions of red, green, and blue. That is, it was found that when the emission intensity ratio r was large, such as 0.516, a loss in color separation by the color filter was increased, and efficiency was decreased.

Comparative Example 3

A display device was fabricated as in Example 1, except that the construction of the light emitting layer of the organic light emitting device was different. Then, the light emitting layer had a construction, wherein a blue-green light emitting layer made of a mixture, wherein 5 volume % of PAVB was mixed into DPVBi being 15 nm thick, and a red light emitting layer made of BSN being 10 nm thick were sequentially layered from the first electrode side. That is, in this comparative example, the blue-green light emitting component included in a spectrum was increased compared to in Example 1.

Figure 17:
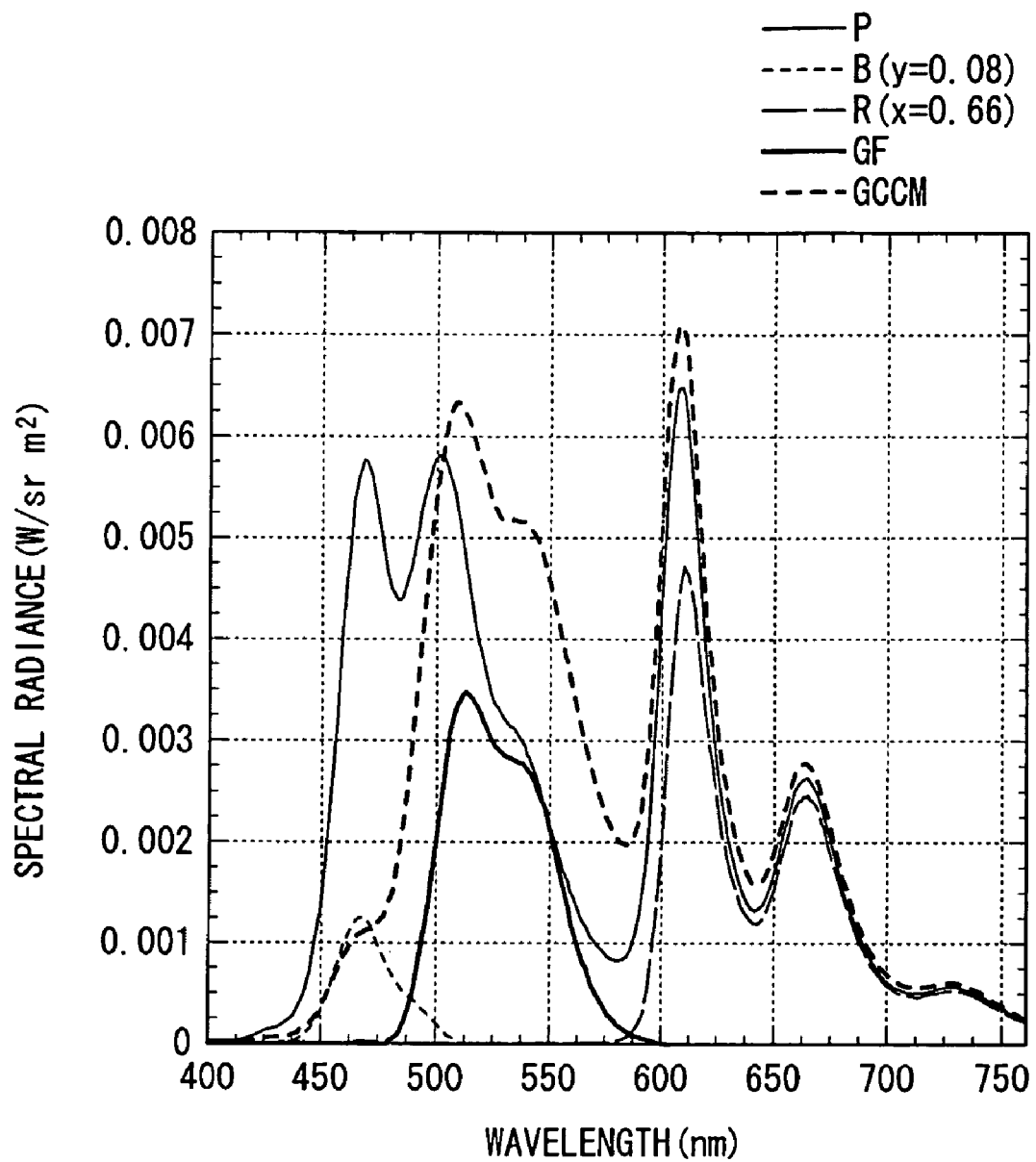
FIG. 17 is a view showing spectrums of a display device of Comparative example 3 of the invention.

Regarding the obtained organic light emitting device, a spectrum was measured. Measurement conditions were a current density of 1 mA/cm$^2$ and 4.9 V. The obtained spectrum P is shown in FIG. 17. Further, when the emission intensity ratio r of this spectrum was obtained by Mathematical formula 2, r was 0.457.

Further, a blue filter layer was combined with this organic light emitting device to obtain chromaticity y=0.08. Spectrum B when transmittance of the blue filter layer was 21% is also shown in FIG. 17, and chromaticity coordinates and luminance then are shown in Table 4.

TABLE 4

|   | Chromaticity coordinates | | Luminance L |
|---|---|---|---|
|   | X | Y | (cd/m$^2$) |
| B | 0.124 | 0.080 | 1.6 |
| G | 0.200 | 0.710 | 48 |
| R | 0.670 | 0.326 | 20.9 |

Further, a red filter layer was combined with this organic light emitting device to obtain chromaticity x=0.67. Spectrum R when transmittance of the red filter layer was 75% is also shown in FIG. 17, and chromaticity coordinates and luminance are also shown in Table 4.

Further, spectrum GF when a green filter layer was combined with this organic light emitting device and green was extracted is also shown in FIG. 17. Further, emission intensity GCCM when the green filter layer and a green fluorescence conversion layer were combined with the organic light emitting device is also shown in FIG. 17, and chromaticity coordinates and luminance are also shown in Table 4.

Further, when a luminance half period of this organic light emitting device was measured, a result equal to in Example 1 was obtained.

As evidenced by FIG. 17 and Table 4, since the green fluorescence conversion layer was used, relatively good chromaticity was obtained for green. However, efficiency of blue was significantly low. The reason thereof was that the spectrum P having the large emission intensity ratio r, 0.457 was used, the color filter of blue having low transmittance and higher density was used in order to obtain chromaticity of blue. That is, it was found that when the emission intensity ratio r was large, such as 0.457, a loss in color separation by the color filter was increased, and efficiency was decreased.

While the invention has been described with reference to the embodiments and examples, the invention is not limited to the foregoing embodiments and the foregoing examples, and various modifications may be made. For example, the materials and the thicknesses, or the deposition methods and the deposition conditions for the respective layers described in the foregoing embodiments and the foregoing examples can be other materials and thicknesses, or other deposition methods and deposition conditions. For example, in the foregoing embodiments and the foregoing examples, the case that the light emitting layer 13C is made of the fluorescence light emitting material has been described. However, phosphorescence materials, whose performance has been significantly improved recently can be used. In this case, all of a plurality of light emitting layers can be made of the phosphorescence material, or part there of can be made of the phosphorescence material in view of life. Further, for example, in the foregoing embodiments and the foregoing examples, the case that coumarin 6 is used as a component material for the green fluorescence conversion layer 23 has been described. However, the green fluorescence conversion layer 23 can be made of other material. For example, if a high-efficiency color conversion layer using the phosphorescence is developed in the future, efficiency can be further improved by using it.

Further, for example, in the foregoing embodiments and the foregoing examples, constructions of the organic light emitting device, the display device, the display unit, and the imaging device have been described with reference to the concrete examples. However, it is not necessary that all layers or all components are provided. Further, other layers or other components can be further provided. For example, the second electrode 14 can be a transparent electrode.

Further, for example, in the foregoing embodiments and the foregoing examples, the case that the first electrode 12 is an anode and the second electrode 14 is a cathode has been described. However, it is possible to reverse the anode and the cathode, that is, to use the first electrode 12 as a cathode and the second electrode 14 as an anode.

Further, for example, in the second embodiment, the case of the tandem structure, wherein the blue organic layer 13B and the red organic layer 13R are layered through the intermediate electrode 15 has been described. However, it is possible that a plurality of organic layers having a red light emitting layer and a blue light emitting layer is layered to obtain the tandem structure. Further, the tandem structure is not limited to the structure, wherein two organic layers are layered. The tandem structure can have three or more organic layers.

Further, in the foregoing embodiments and the foregoing examples, descriptions have been given of the case using the organic light emitting device 10M as a light emitting device. However, in addition to the organic light emitting device, the invention can be also applied to a display device having other light emitting device such as an inorganic EL device for performing AC drive by using a light emitting layer made of an inorganic material.

Obviously many modifications and variations of the present invention are possible in the light of the above teachings. It is therefore to be understood that within the scope of the appended claims the invention may be practiced otherwise than as specifically described.

What is claimed is:

1. A display device comprising:
   a driving panel having an organic light emitting device which includes
   (a) a first electrode provided above a substrate,
   (b) a light emitting layer provided above the first electrode including
      a blue light emitting layer provided above the first electrode,
      a middle electrode provided above the blue light emitting layer,
      a red light emitting layer provided above the middle electrode, and
      a second electrode provided above the red light emitting layer;
   (c) an adhesive layer provided above the light emitting layer;

(d) a sealing substrate provided above the adhesive layer;

(e) a color filter structure between the sealing substrate and the light emitting layer, the color filter structure having three filter layers respectively corresponding to the colors of blue, red, and green; and (f) a single fluorescence conversion layer provided between the light emitting layer and the green filter layer of the color filter structure, the fluorescence conversion layer absorbing blue light but transmitting green light, wherein, the organic light emitting device emits a blue and red light at a wavelength between and including 420 nm to 680 nm.

2. A display device according to claim 1, wherein the blue light emitting layer and the red light emitting layer are made of an organic material.

3. A display device according to claim 1, wherein the color filter structure includes a cyan color filter layer, and the device comprises a cyan fluorescence conversion layer between the light emitting layer and the cyan filter layer, the cyan fluorescence conversion layer absorbing blue light but transmitting cyan light.

4. A display device according to claim 1, wherein the color filter transmits 70% or more of wavelengths of 455 nm and 630 nm respectively.

5. A display device according to claim 1, further including a reflective layer on a side of the light emitting layer, which reflects light generated in the light emitting device in the direction of the color filter.

6. A display device according to claim 5, wherein:

the light emitting layer and the reflective layer are provided on a driving substrate to constitute a driving panel;

the color filter and the green fluorescence conversion layer are provided on a sealing substrate to constitute a sealing panel; and the driving panel and the sealing panel are bonded together with an adhesive layer in between them.

7. A display device comprising:

a driving panel having an organic light emitting device which includes (a) a first electrode provided above a substrate, (b) a light emitting layer provided above the first electrode including a blue light emitting layer provided above the first electrode, a middle electrode provided above the blue light emitting layer, a red light emitting layer provided above the middle electrode, a second electrode provided above the red light emitting layer;

(c) an adhesive layer provided above the light emitting layer;

(d) a sealing substrate provided above the adhesive layer;

(e) a color filter structure between the light emitting layer and the sealing substrate, the color filter structure having three filter layers respectively corresponding to the three colors of blue, red and green; and a single fluorescence conversion layer between the light emitting device and the green filter layer of the color filter structure, the fluorescence conversion layer absorbing blue light by transmitting green light, wherein, an emission intensity ratio r of the light emitting device is from 0.1 to 0.45 in accordance with the relationship r=A/B (Mathematical formula 1), where A represents a value obtained by integrating emission intensity of wavelengths from 480 nm to 590 nm in the spectrum of the light emitting device, and B represents a value obtained by integrating emission intensity of wavelengths from 420 nm to 680 nm in the spectrum of the light emitting device, respectively, the organic light emitting device emits blue light, red light and green light the light emission intensity of the green light is relatively lower than that of the blue light and the red light, and the organic light emitting device emits a blue and red light at a wavelength between and including 420 nm to 680 nm.

8. An imaging device comprising:

an imaging portion capturing an image; and a display portion comprising a display device, which displays the image captured by the imaging portion, the display device includes a driving panel having an organic light emitting device including (a) a first electrode provided above a substrate, (b) a light emitting layer provided above the first electrode which includes a blue light emitting layer provided above the first electrode, a middle electrode provided above the blue light emitting layer, a red light emitting layer provided above the middle electrode, a second electrode provided above the red light emitting layer, (c) an adhesive layer provided above the light emitting layer;

(d) a sealing substrate provided above the adhesive layer;

(e) a color filter structure between the sealing substrate and the light emitting layer, the color filter having three filter layers respectively corresponding to the colors, blue, red, and green; and a single fluorescence conversion layer between the light emitting device and the green filter layer of the color filter structure, the fluorescence conversion layer absorbing blue light but transmitting green light, wherein, the organic light emitting device emits a blue and red light at a wavelength between and including 420 nm to 680 nm.

9. An imaging device according to claim 8, wherein the blue light emitting layer and the red light emitting layer are made of an organic material.

10. An imaging device according to claim 9, wherein the color filter also includes a cyan filter layer, and imaging device comprises a cyan fluorescence conversion layer between the light emitting device and the cyan filter layer, the cyan fluorescence conversion layer absorbing blue light but transmitting cyan light.

* * * * *